United States Patent [19]
Cole

[11] Patent Number: 5,486,825
[45] Date of Patent: Jan. 23, 1996

[54] CONVOLUTIONAL ENCODERS FOR MODEMS WHICH IMPLEMENT THE "COLE CODE"

[75] Inventor: Paul D. Cole, Fairfield, Conn.

[73] Assignee: General DataComm, Inc., Middlebury, Conn.

[21] Appl. No.: 230,682

[22] Filed: Apr. 20, 1994

[51] Int. Cl.$^6$ ....................................................... H03M 7/00
[52] U.S. Cl. ................................................. 341/50; 371/43
[58] Field of Search ................................. 341/50; 375/39, 375/42, 27, 54, 55; 371/43

[56] References Cited

U.S. PATENT DOCUMENTS 4,713,817  12/1987  Wei ............................................ 371/43
5,113,412  5/1992  Goldstein .................................. 375/39

Primary Examiner—Brian K. Young
Attorney, Agent, or Firm—David P. Gordon

[57] ABSTRACT

A sixty-four state convolutional code known as the "Cole code" is disclosed and take systematic and non-systematic forms. The state variables of the Cole code are $r(n-1)$, $r(n-2)$, $s(n-1)$, $s(n-2)$, $p(n-1)$, and $x(n-1)$. In the four-to-five non-systematic form, four inputs $p(n)$, $q(n)$, $r(n)$ and $s(n)$ are used to generate five outputs $y_4(n)$, $y_3(n)$, $y_2(n)$, $y_1(n)$, and $y_0(n)$ according to: $y_4(n)=q(n)$; $y_3(n)=p(n)+r(n)r(n-1)+r(n-2)+r(n-1)s(n)+r(n-1)s(n-2)$; $y_2(n)=r(n-1)+s(n)+s(n-2)$; $y_1(n)=r(n)+r(n-1)r(n-2)+p(n-1)+p(n-2)+q(n-1)$; and $y_0(n)=s(n-1)$, where $p(n-2)+q(n-1)=x(n-1)$. New state variables are obtained directly from the inputs and from the previous state variables, except for $x(n)$ which is equals $q(n)+p(n-1)$. In a three-to-four non-systematic implementation of the Cole code, $q(n)$ is not input, $y_4$ is not output, and $q(n-1)$ is set equal to zero. In the four-to-five systematic form of the Cole code, the inputs $y_4, y_3, y_2, y_1$ are taken as outputs and are also used on conjunction with the convolutional encoder to generate a fifth output $y_0$. With state variables $x(n-1)$, $p(n-1)$, $r(n-1)$, $r(n-2)$, $s(n-1)$, $s(n-2)$ relabeled as $w_1, w_2, w_3, w_4, w_5$, and $w_6$, output $y_0$ is taken as state variable $w_5$. The state variables are updated according to: new $w_6=w_5$; new $w_5=y_2+w_3+w_6$; new $w_4=w_3$; new $w_3=y_1+w_3w_4+w_2+w_1$; new $w_2=y_3+(\text{new } w_3)w_3+w_4+w_3(\text{new } w_5)+w_3w_6$; and new $w_1=y_4+w_2$. In the three-to-four systematic Cole code, $y_4$ is taken as zero.

16 Claims, 6 Drawing Sheets

CONVOLUTIONAL ENCODERS FOR MODEMS WHICH IMPLEMENT THE " COLE CODE"

BACKGROUND OF THE INVENTION

1. Field of the Invention

The present invention relates generally to convolutional encoders for modems. More particularly, the present invention relates to rotationally invariant convolutional encoders of modems capable of implementing a sixty-four state convolutional code which will support a four-to-five trellis code.

2. State of the Art

It is well known in the modem arts how to increase the signal to noise ratio of a modem by encoding bits of data which are to be modulated and sent over a telecommunications channel. In the encoding of bits, it has become relatively standard to employ a Trellis encoder. The Trellis encoder typically comprises a convolutional encoder and a mapper. Briefly, the convolutional encoder is a state update machine which receives inputs and generates outputs as a function of the inputs and/or the state of the machine at the time. In addition to generating outputs, the state update machine updates its state. Generally, the outputs of the convolutional encoder number one more than the inputs, thereby providing a redundancy which helps increase the signal-to-noise ratio of the system. The mapper receives as inputs the outputs of the convolutional encoder as well as other bits, and maps those inputs to one or more constellation points from which modulated signals are generated. When the mapper generates a single x,y constellation point value from the inputs, the system is said to be a two dimensional (2D) system. When the mapper generates two x,y constellation point values from the inputs, the system is said to be a four dimensional (4D) system, with the concatenation of the two x,y constellation points constituting a single point in a 4D "constellation".

Much attention has recently been paid to the code which is used in the convolutional encoder, as the code can effect the signal-to-noise ratio. The code of the convolutional encoder may be defined by the states of the convolutional encoder as connected by the outputs, or equivalently, the outputs of the convolutional encoder as connected by the states. Regardless, various different codes are known in the art. For example, a sixteen state, 4D code, a sixty-four state, 8D code, and a sixty-four state 4D code are described in U.S. Pat. No. 4,713,817 to Wei which is hereby incorporated by reference herein in its entirety. The sixty-four state, 4D code known as the "Wei code" as described in U.S. Pat. No. 4,713,817 was at one time proposed as the code for the new V.34 (V.fast) standard.

In the case of 4D codes, the mapper inputs taken from the convolutional encoder are used to select a subset within a four dimensional (4D) constellation. The other mapper inputs select a 4D constellation point within the 4D subset. These 4D subsets are predefined in terms of a partitioning of the 2D constellation points, with the sixteen state code employing eight 4D subsets derived from a four-way 2D partitioning, and the sixty-four state code employing thirty-two 4D subsets derived from an eight-way 2D partitioning obtained by splitting each set in the 4 way partitioning. These 4D subsets are labeled by three bit words and five bit words respectively.

With the 4D subsets and their labeling specified, it remains to define a convolutional encoder. The redundant bit inserted by the convolutional encoder doubles the number of 4D constellation points required for transmitting a given number of data bits per 4D point. The efficacy of Trellis encoding is based upon the premise that this redundancy penalty is exceeded substantially by an increased separation between the sequence of 4D points generated by the Trellis encoder. The convolutional encoder, which generates only some and not all possible sequences, provides this separation. The extent to which the separation provided by the convolutional encoder exceeds the redundancy penalty is the main measure of its performance with the Trellis encoder employing it.

All Trellis codes described in U.S. Pat. No. 4,713,817 to Wei have the following property, known as 90° rotational invariance: the 0°, 90°, 180° and 270° rotation about the origin of any sequence of points generated by the Trellis encoder is itself a sequence of points generated by the Trellis encoder. In modem applications, rotational invariance is important because channel impairments can lead to phase ambiguities in the receiver. The rotations about the origin taking the thirty-two 4D subsets employed by the sixty-four state code to each other are 0°, 90°, 180°, 270°, and the same is true for the eight 4D subsets employed by the sixteen state code. So, a Trellis encoder employing of these collections of 4D subsets is rotationally invariant if and only if the convolutional encoder employed has the corresponding rotational invariance property.

The construction of rotationally invariant Trellis codes providing good separation between sequences is taught by U.S. Pat. No. 4,713,817 to Wei. It is the case, however, that the sixty-four state 4D code described in the Wei patent does not provide the separation between sequences suggested by the patent. In particular, the convolutional encoder employed in U.S. Pat. No. 4,713,817 to Wei is quasi-catastrophic; i.e., it fails to provide the property that any two sequences emerging from the same state must eventually merge into the same state, or else the separation between the two sequences becomes arbitrarily large. A convolutional encoder which provides this property is said to be non-quasi-catastrophic. While quasi-catastrophic codes can generally function without negatively affecting the output of the modem, it is theoretically possible that a sequence of inputs could cause a failure in the modem. Thus, it is desirable to utilize codes which are non-quasi-catastrophic.

SUMMARY OF THE INVENTION

It is therefore an object of the invention to provide a code for a convolutional encoder which is non-quasi-catastrophic.

It is another object of the invention to provide a non-quasi-catastrophic sixty-four state convolutional code which supports both a four-to-five Trellis code, and a three-to-four Trellis code.

It is a further object of the invention to provide a non-quasi-catastrophic sixty-four state convolutional code for 4D constellations which can be used in the V.34 standard.

It is an additional object of the invention to provide both systematic and non-systematic implementations of a non-quasi-catastrophic sixty-four state convolutional code which is rotationally invariant.

In accord with the objects of the invention, the sixty-four state rotationally invariant non-quasi-catastrophic convolutional code of the invention, also known as the "Cole code", is provided. The Cole code is a sixty-four state convolutional code which, when used in conjunction with the collection of thirty-two 4D subsets described above in the Background, results in a rotationally invariant 4D Trellis encoder whose sequence separation performance measure is that posited by, but not actually realized by the sixty-four state 4D Trellis encoder described in U.S. Pat. No. 4,713,817 to Wei. It should be noted that the labeling of the convolutional encoder output bits used with reference to the Cole code as described below differs slightly, but corresponds exactly to the labeling of the Wei patent. In particular, the outputs described below as $y_0$, $y_1$, $y_2$, $y_3$, and $y_4$ correspond to Wei's outputs Y0, I2, I3', I4', and I1 With this difference of labeling taken into account, the mapper algorithm used in the codes hereinafter described is identical to the mapper algorithm used by the sixty-four state 4D code described in Wei.

According to the invention, the sixty-four state convolutional Cole code takes a first non-systematic form, and a second systematic form. In a four-to-five non-systematic form of the Cole code, the four inputs $p(n)$, $q(n)$, $r(n)$, and $s(n)$ at time n are used to generate the five outputs $y_4(n)$, $y_3(n)$, $y_2(n)$, $y_1(n)$, and $y_0(n)$ according to:

$$y_4(n)=q(n) \qquad (1)$$

$$y_3(n)=p(n)+r(n)r(n-1)+r(n\ 2)+r(n-1)s(n)+r(n-1)s(n-2) \qquad (2)$$

$$y_2(n)=r(n-1)+s(n)+s(n-2) \qquad (3)$$

$$y_1(n)=r(n)+r(n-1)r(n-2)+p(n-1)+p(n-2)+q(n-1) \qquad (4)$$

$$y_0(n)=s(n-1) \qquad (5)$$

where the current state is the vector $(r(n-1); r(n-2); s(n-1); s(n-2); p(n-1); x(n-1))$ and where $$x(n-1)=p(n-2)+q(n-1). \qquad (6)$$

In the non-systematic form, the state vector $(r(n-1); r(n-2); s(n-1); s(n-2); p(n-1); x(n-1))$ which defines sixty-four states ($2^6$) is simply updated to a new state vector $(r(n); r(n-1); s(n); s(n-1); p(n); x(n))$, where $x(n)=q(n)+p(n-1)$. As will be appreciated, except for the update from $x(n-1)$ to $x(n)$ which would typically be accomplished via logic implementation means (e.g., logic circuitry or a look-up table), in the non-systematic form of the Cole code, all of the other updates are simply accomplished by a shift register or the equivalent thereof (e.g., delay lines). It should also be appreciated that the Cole code supports a three-to-four code, where the inputs are $p(n)$, $r(n)$, and $s(n)$, and the output bits at time n are $y_3(n)$, $y_2(n)$, $y_1(n)$, and $y_0(n)$, where at all times t, the state operations are identically calculated with zero being substituted for $q(t)$; i.e., $x(n-1)=p(n-2)$.

In the three-to-four code, instead of employing thirty-two 4D subsets derived from the eight-way 2D partitioning, the Trellis encoder employs sixteen 4D subsets derived from the four-way 2D partitioning. The sequence separation provided by this code exceeds that provided by the sixteen state 4D Trellis code described in U.S. Pat. No. 4,713,817 to Wei, but is inferior to the sequence separation provided by the sixty-four state 4D Trellis code based on the eight-way 2D partitioning described herein.

In the four-to-five systematic form of the Cole code useful in arrangements now known as ISI coding, the same six state variables (state vector) set forth in the non-systematic form of the Cole code are utilized. However, the updating of the state variables is different, and the outputs are different with four of the five output bits being equal to the four input bits into the convolutional encoder, while the fifth output bit ($y_0$) is taken as equal to one of the state variables. In particular, if the state variables $x(n-1)$, $p(n-1)$, $r(n-1)$, $r(n-2)$, $s(n-1)$, $s(n-2)$, are relabeled (arbitrarily) as $w_1$, $w_2$, $w_3$, $w_4$, $w_5$, and $w_6$, the outputs $y_4$, $y_3$, $y_2$, $y_1$ are equal to their related inputs, and the output $y_0$ is taken as equal to state variable $w_5$, while the state variables are updated according to:

$$\text{new } w_6=w_5 \qquad (7)$$

$$\text{new } w_5=y_2+w_3+w_6 \qquad (8)$$

$$\text{new } w_4=w_3 \qquad (9)$$

$$\text{new } w_3=y_1+w_3w_4+w_2+w_1 \qquad (10)$$

$$\text{new } w_2=y_3+(\text{new } w_3)w_3+w_4+w_3(\text{new } w_5)+w_3w_6 \qquad (11)$$

$$\text{new } w_1=y_4+w_2 \qquad (12)$$

Equations (7) through (12) are essentially a relabeled rearrangement of equations (1) through (6) above.

The systematic Cole code may also be used as a three-to-four code with outputs $y_3(n)$, $y_2(n)$, $y_1(n)$, and $y_0(n)$, where at all times t, the state operations are identically calculated with zero being substituted for $y_4$; i.e., new $w_1=w_2$.

Additional objects and advantages of the invention will become apparent to those skilled in the art upon reference to the detailed description taken in conjunction with the provided figures.

DETAILED DESCRIPTION OF THE PREFERRED EMBODIMENTS

Figure 1:
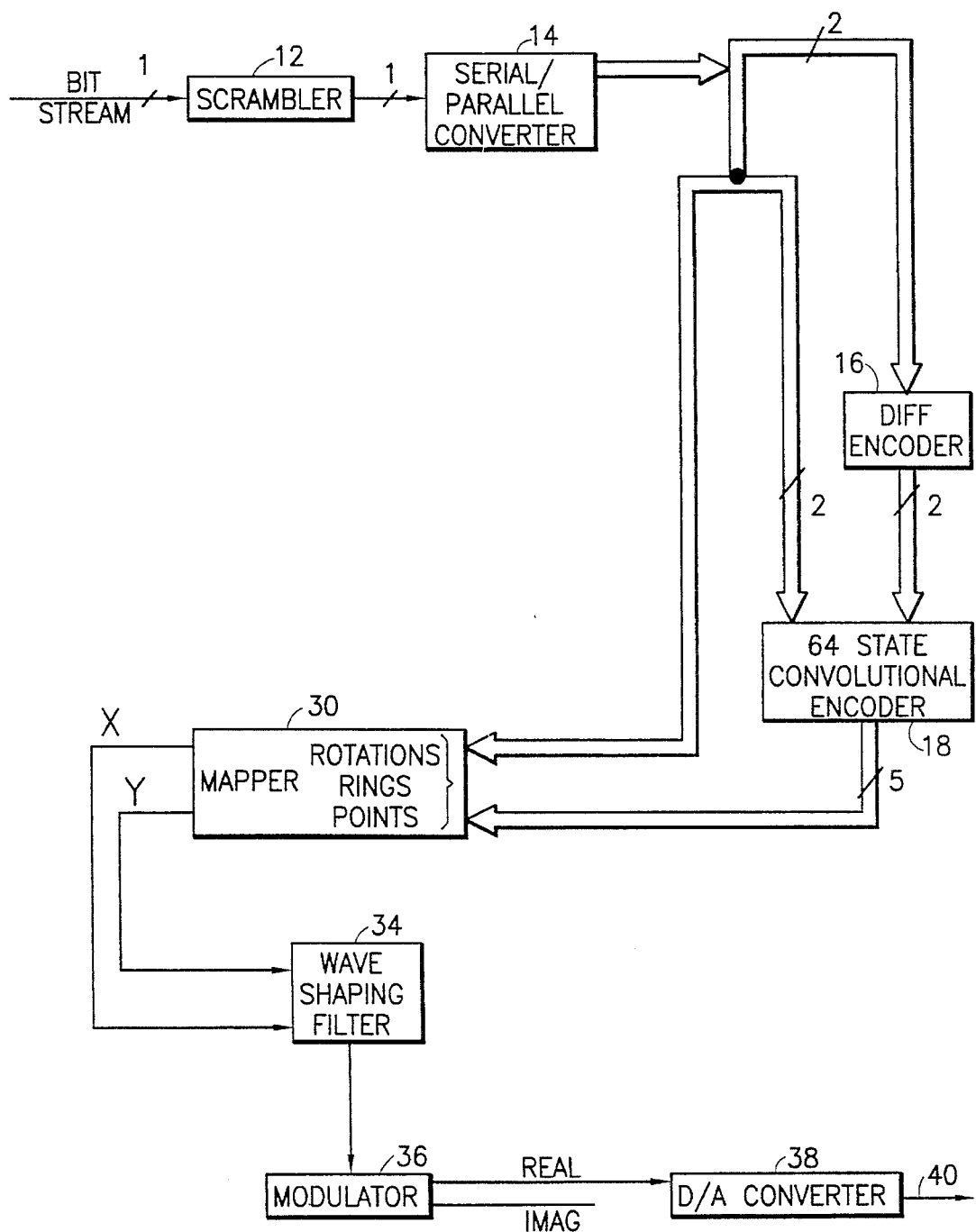
FIG. 1 is a block diagram of a prior art non-systematic encoder which incorporates a Trellis encoder therein.

Referring to FIG. 1, and in accord with the preferred embodiment, an incoming serial bit stream is scrambled by scrambler 12 and sent to a serial-to-parallel converter 14 which generates a parallel word of a plurality of bits. Of the plurality of bits, a first number of bits are chosen as described in the aforementioned Wei patent. Of that first number of bits, two bits preferably are sent to a differential encoder 16. The outputs of the differential encoder 16 are two differentially encoded bits which are preferably sent with one or two additional bits to a sixty-four state convolutional encoder 18 which adds one redundant bit. The four or five convolutionally encoded bits are then sent together with the remaining bits which were not chosen for encoding to a bit mapper 30 which takes the bits and typically generates therefrom at least one 2D coordinate pair; (two consecutive 2D signal points). The coordinate pair is then typically sent serially (one pair per baud) via a shaping filter 34 to a modulator 36 which modulates them onto a carrier.

The real part of the modulator output is typically then digital-to-analog converted by D/C converter 38 for transmission over a channel 40.

As will be appreciated by those skilled in the art, the convolutional encoder and mapper taken together are generally referred to as a Trellis encoder. The mapper can take many of various forms. It is the convolutional encoder, however, which is primary interest herein.

Figure 2A:
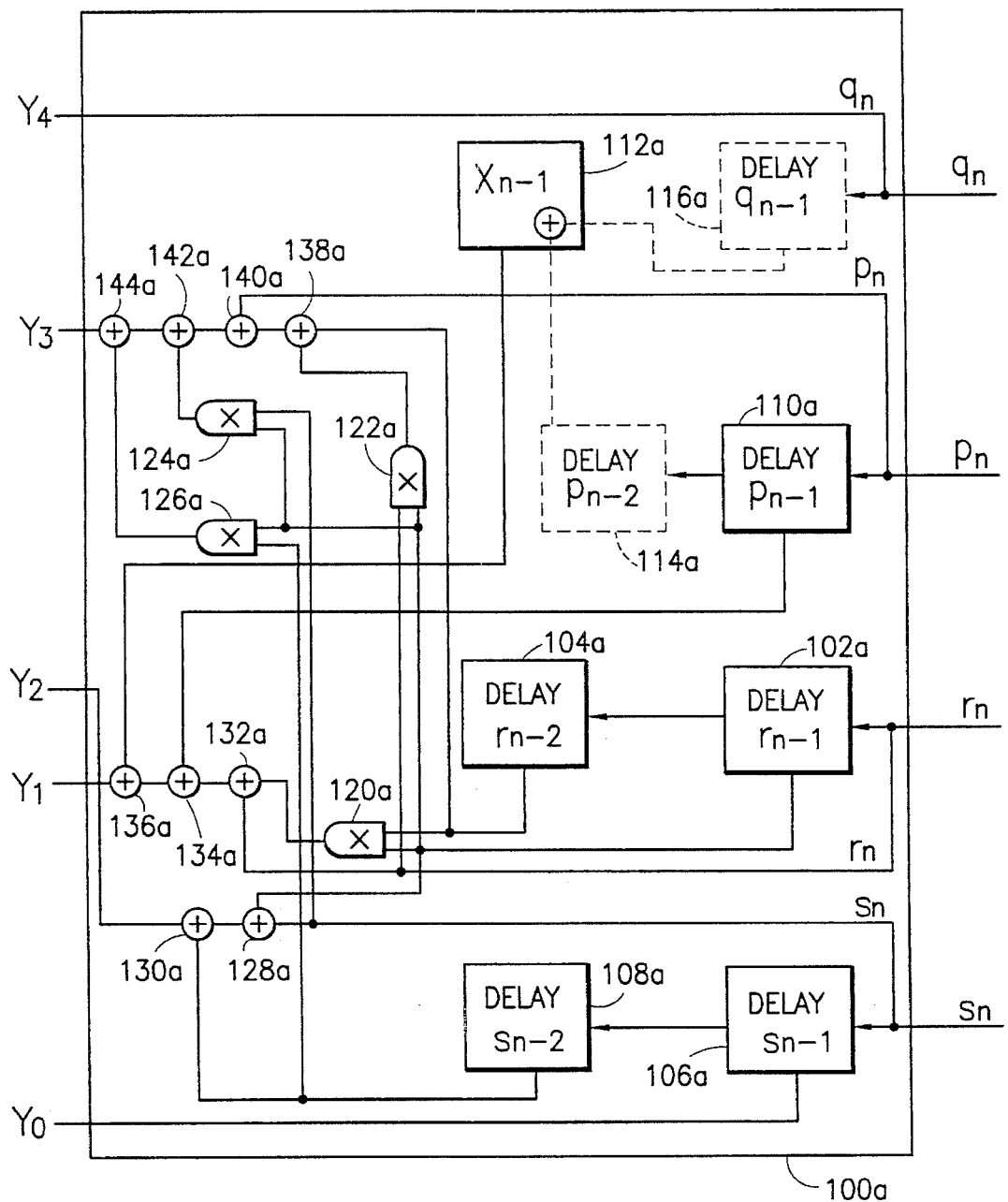
FIG. 2a is a block diagram of a first embodiment of the invention utilizing a non-systematic four to five convolutional encoder which implements the Cole code.

The preferred convolutional encoder according to the invention is a convolutional encoder which implements the "Cole code". As set forth in the Summary section hereof, the "Cole code" may take either a first non-systematic form, or a second systematic form. A first four-to-five embodiment of the convolutional encoder 100a embodying a non-systematic form of the Cole code is shown in FIG. 2a, where four inputs $p(n)$, $q(n)$, $r(n)$, and $s(n)$ at time n are used to generate the five outputs $y_4(n)$, $y_3(n)$, $y_2(n)$, $y_1(n)$, and $y_0(n)$. The outputs are generated based on the inputs as well as the state variables of the sixty-four state convolutional encoder. The state variables $r(n-1)$, $r(n-2)$, $s(n-1)$, $s(n-2)$, $p(n-1)$, $x(n-1)$ of the Cole code are implemented as delay blocks or shift registers 102a, 104a, 106a, 108a, 110a, and 112a, and, with the exception of the state variable $x(n-1)$, are simply obtained and updated (as indicated by the arrows) by shifting the inputs at time increments. The state variable $x(n-1)$ is obtained according to equation (6) above. Thus, a $p(n-2)$ delay or shift register block 114a and a $q(n-1)$ delay or shift register block 116a are shown in phantom in FIG. 2a, as they are used to generate the state variable $x(n-1)$ (without delay) by addition of their values as indicated in block 112a. The value for state variable $x(n-1)$ is alternately obtained via a look-up table (not shown)

Using the state variables 102a, 104a, 106a, 108a, 110a, and 112a, and the logic circuitry, including AND gate binary multipliers 120a, 122a, 124a, and 126a, and binary adders 128a, 130a, 132a, 134a, 136a, 138a, 140a, 142a, and 144a, the outputs $y_0(n)$–$y_4(n)$ are generated according to equations (1) through (5) set forth above, $$y_4(n)=q(n) \quad (1)$$

$$y_3(n)=p(n)+r(n)r(n-1)+r(n-2)+r(n-1)s(n)+r(n-1)s(n-2) \quad (3)$$

$$y_2(n)=r(n-1)+s(n)+s(n-2) \quad (4)$$

$$y_0(n)=s(n-1) \quad (5)$$

where $x(n-1)=p(n-2)+q(n-1)$. It will be appreciated by those skilled in the art that other circuitry could be utilized to obtain the same results.

Figure 2B:
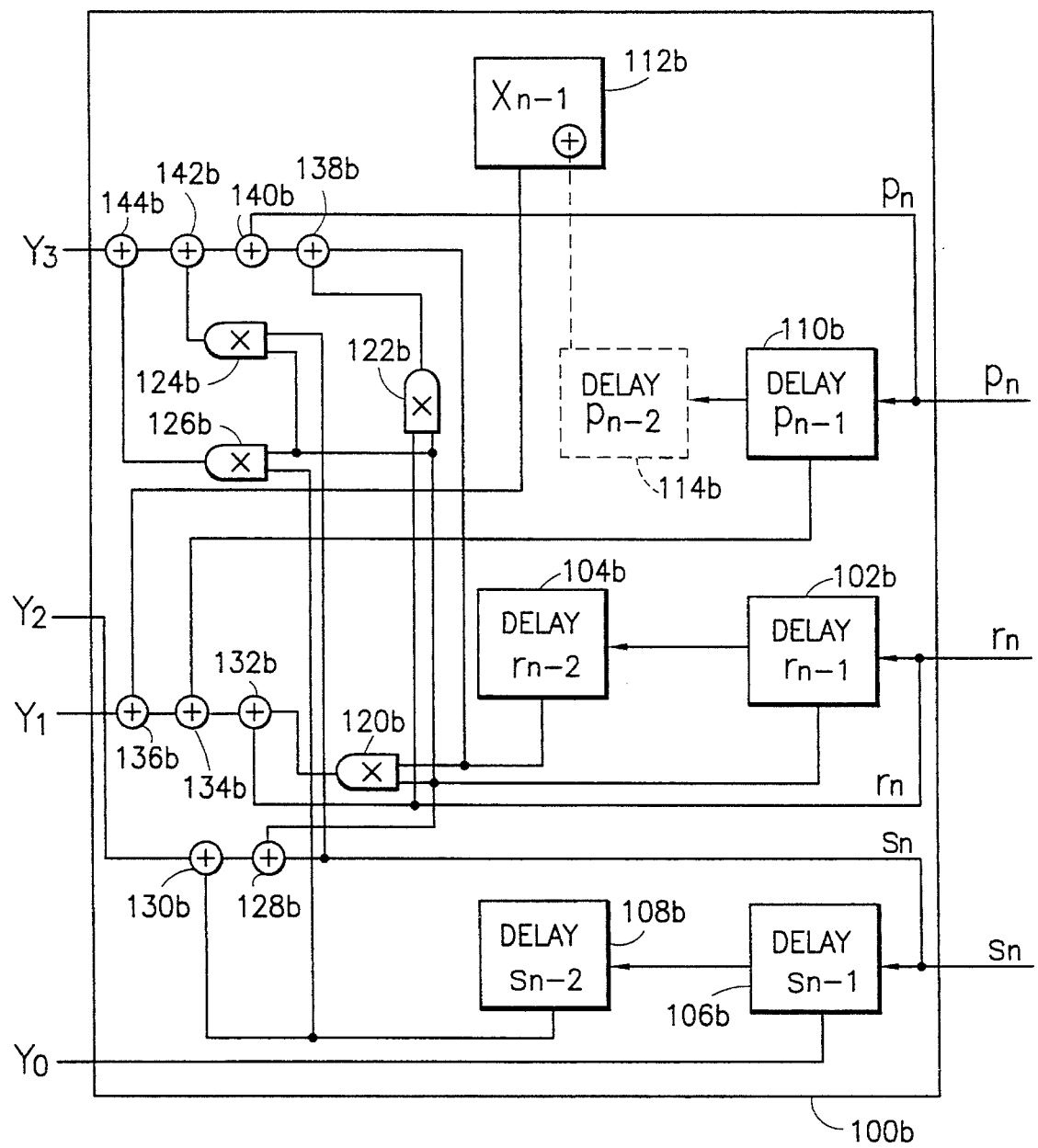
FIG. 2b is a block diagram of a second embodiment of the invention utilizing a non-systematic three to four convolutional encoder which implements the Cole code.

Turning to FIG. 2b, a second embodiment of the invention is seen where a three-to-four embodiment of the non-systematic form
of the Cole code is implemented in a convolutional encoder 100b. The three-to four embodiment of the Cole code includes three inputs $p(n)$, $r(n)$, and $s(n)$ at time n which are used to generate the four outputs $y_3(n)$, $y_2(n)$, $y_1(n)$, and $y_0(n)$. Essentially, the embodiment of FIG. 2b is identical to the embodiment of FIG. 2a (with like parts being numbered identically except for the identifiers "a" and "b"), except that zero is substituted for $q(t)$ in FIG. 2b such that input $q(n)$, phantom block $q(n-1)$, and output $y_4(n)$ are not found, and $x(n-1)$ is set equal to $p(n-2)$. Thus, it is seen that the Cole code supports a three-to-four convolutional encoder as well as a four-to-five convolutional encoder.

Figure 3:
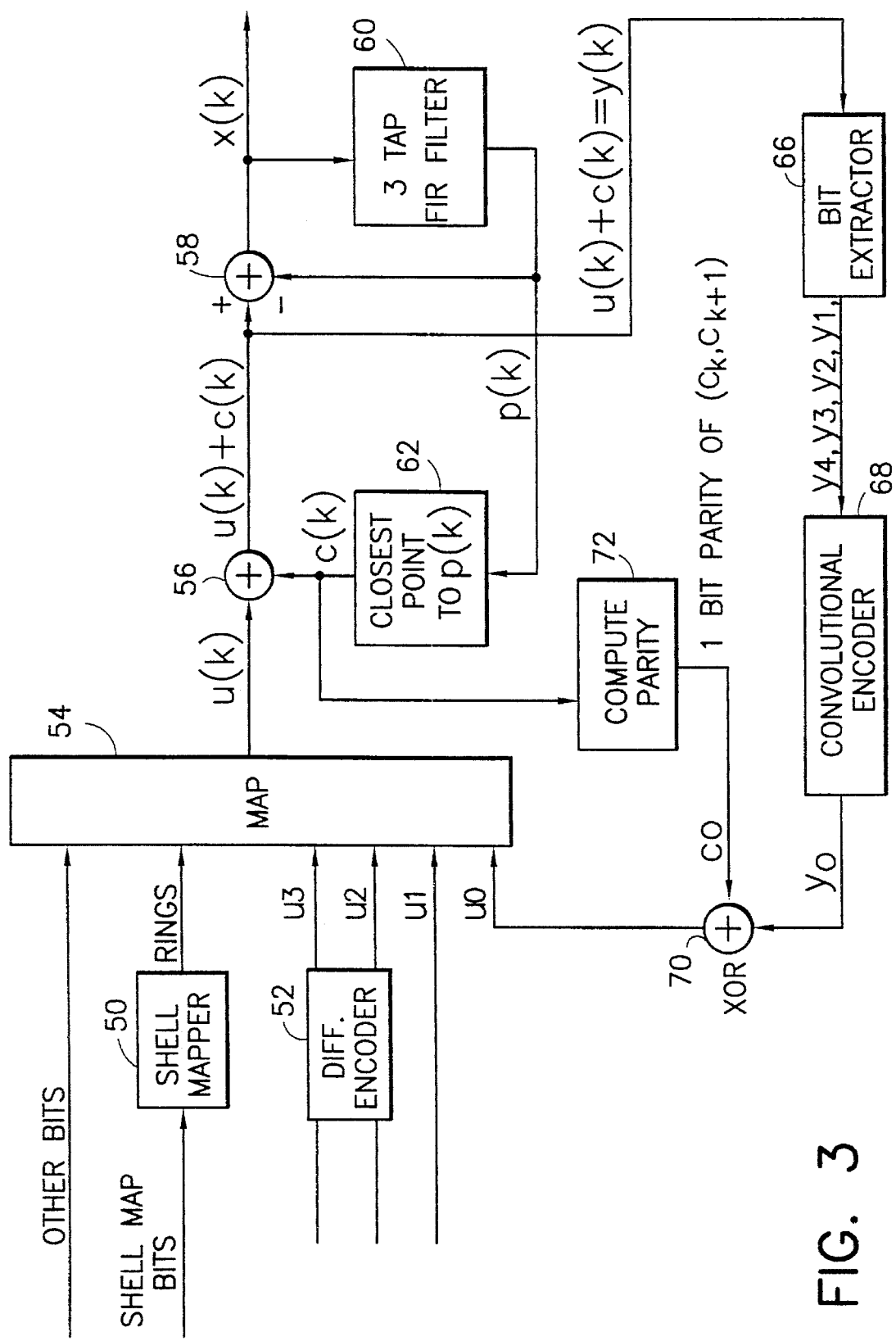
FIG. 3 is a block diagram of a preferred systematic encoder of the invention.

As suggested above, the Cole code can be embodied in systematic forms. A preferred embodiment of the systematic encoder is seen in FIG. 3. For purposes herein, it should suffice to note with reference to FIG. 3 that a shell mapper 50 is used in conjunction with a differential encoder 52 to provide a plurality of bits to a mapper 54. Additional "other bits" and a feedback bit (U0) are also provided to the mapper 54. The mapper 54 provides a serial stream of points u(k) which are added at adder 56 to points of a 2D lattice c(k) to provide a stream of points u(k)+c(k)=y(k). At 58, complex numbers or points p(k) are subtracted from the points u(k)+c(k) to provide outputs x(k) which are output modulated and converted for output on a telecommunications channel. In addition, the outputs x(k) are sent to a delay line 60. The outputs of the delay line 60 are taken as p(k), and the closest point to p(k) is taken as c(k) at 62 and fed back to adder 56.

As seen in FIG. 3, points y(k) are taken in pairs at bit extractor 66 which generates from two y(k) points the inputs $y_4$, $y_3$, $y_2$, and $y_1$ to the convolutional encoder 68. The outputs from the convolutional encoder 68 as will be described in more detail below, include the output $y_0$ which is added at adder 70 to parity value C0 to provide the feedback input bit U0 to the mapper 54. The parity value C0 is generated by taking consecutive c(k) outputs from closest point finder 62, and taking the parity of the of two points.

Figure 4A:
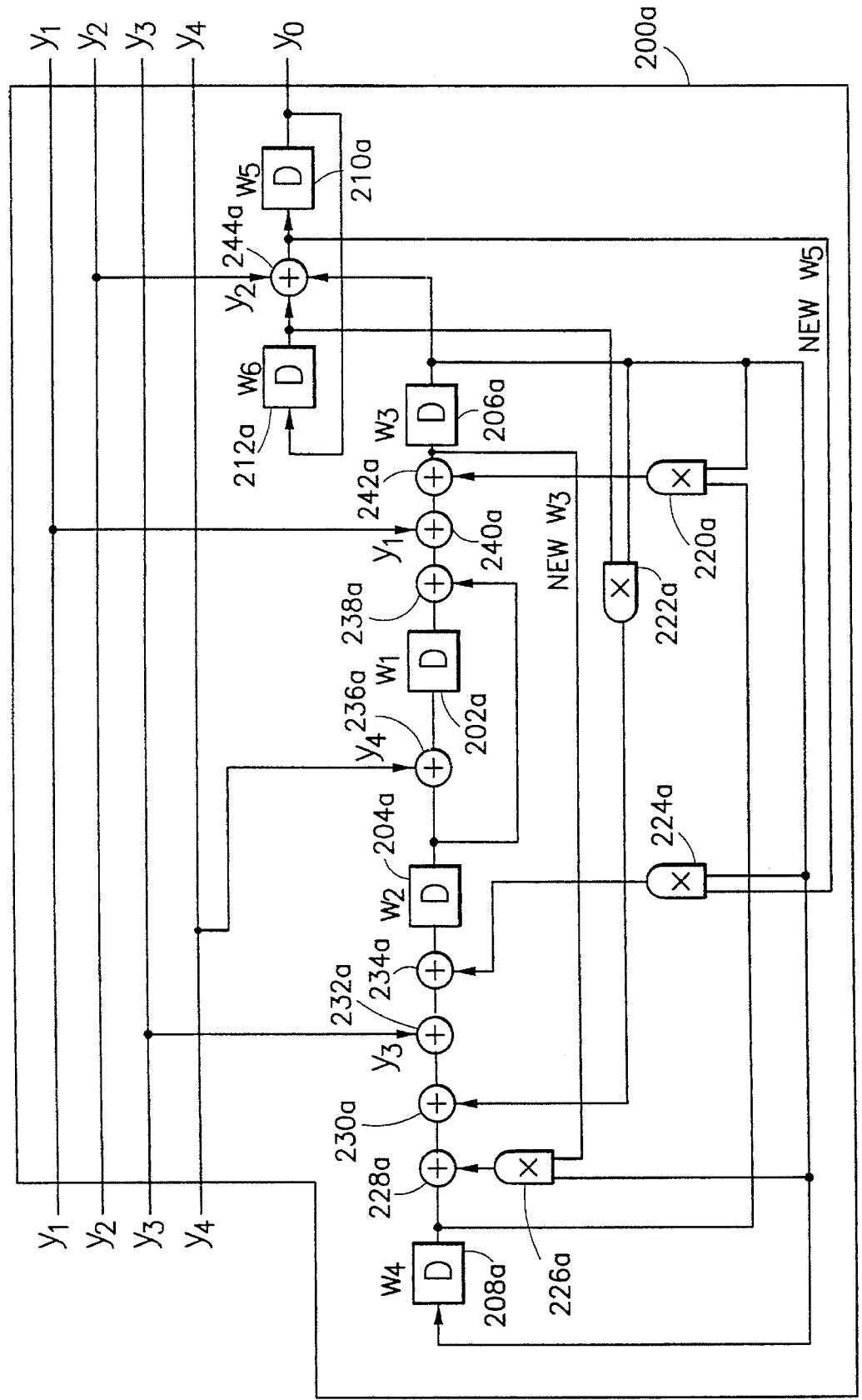
FIG. 4a is a block diagram of a third embodiment of the invention utilizing a systematic four to five convolutional encoder which implements the Cole code.

A first embodiment of a systematic encoder implementing the Cole code which can be substituted for the systematic encoder 68 of FIG. 3 is seen in FIG. 4a. The systematic encoder 200a of FIG. 4a is a four-to-five systematic encoder 200a which utilizes the identical state variables $x(n-1)$, $p(n-1)$, $r(n-1)$, $r(n-2)$, $s(n-1)$, $s(n-2)$ as the non-systematic encoder of FIG. 2a, although the state variables are relabeled in FIG. 4a as $w_1$, $w_2$, $w_3$, $w_4$, $w_5$, and $w_6$ respectively. As seen in FIG. 4a, the inputs are $y_4$, $y_3$, $y_2$, $y_1$, while the outputs include identical $y_4$, $y_3$, $y_2$, and $y_1$ values, with the addition of the fifth output $y_0$. The fifth output $y_0$ is taken as equal to the state variable $w_5$=(s(n-1)).

While the outputs of the systematic encoder embodiment are easily obtained relative to the outputs of the non-systematic encoder, it will be appreciated that the state updates are considerably more complex. Thus, as set forth above, the state variables 202a, 204a, 206a, 208a, 210a, and 212a, are updated according to equations (7)–(12):

$$\text{new } w_6=w_5 \quad (7)$$

$$\text{new } w_5=y_2+w_3+w_6 \quad (8)$$

$$\text{new } w_4=y_3 \quad (9)$$

$$\text{new } w_3=y_1+w_3w_4+w_2+w_1 \quad (10)$$

$$\text{new } w_2=y_3+(\text{new } w_3)w_3+w_4+w_3(\text{new } w_5)+w_3w_6 \quad (11)$$

$$\text{new } w_1=y_4+w_2 \quad (12)$$

In order to implement the state updates, four AND gate multipliers 220a, 222a, 224a, and 226a, and nine adders 228a, 230a, 232a, 234a, 236a, 238a, 240a, 242a, and 244a are used. It is only through all of the state updates and all of the inputs that state $w_5$ is obtainable for use as output $y_0$, as state $w_5$ is dependent upon inputs $y_2$ and states $w_3$ and $w_6$ as seen in equation (8). In turn, state $w_3$ is dependent upon input $y_1$ and states $w_1$, $w_2$, and $w_4$ as seen in equation (10); and states $w_1$, and $w_2$, are dependent upon inputs $y_4$ and $y_3$ as seen in equations (12) and (11). Those skilled in the art will appreciated that other circuitry could be utilized to obtain the same results.

Figure 4B:
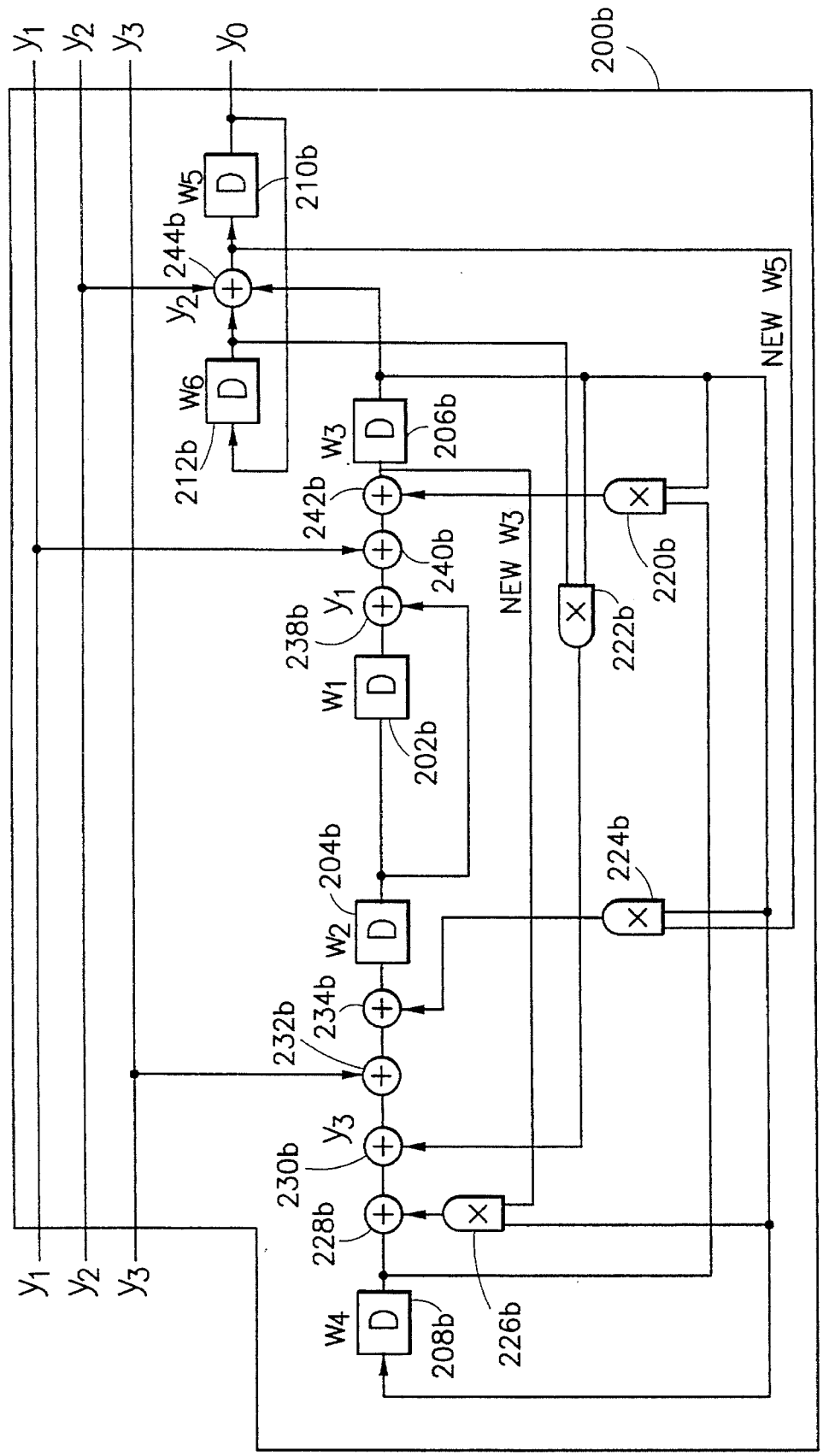
FIG. 4b is a block diagram of a fourth embodiment of the invention utilizing a systematic three to four convolutional encoder which implements the Cole code.

The systematic encoder embodiment of FIG. 4a which implements the Cole code in a systematic format is exactly equivalent to the non-systematic encoder embodiment of FIG. 4b which implements the Cole in a non-systematic format. In particular, if there were no relabling to "w" terminology, equations (7) through (12) would be written as:

$$s(n-1)=s(n-1) \quad (13)$$

$$s(n)=y_2(n)+r(n-1)+s(n-2) \quad (14)$$

$$r(n-1)=r(n-1) \quad (15)$$

$$r(n)=y_1(n)+r(n-1)r(n-2)+p(n-1)+x(n-1) \quad (16)$$

$$p(n)=y_3(n)+r(n)r(n-1)+r(n-2)+r(n-1)s(n)+r(n-1)s(n-2) \quad (17)$$

$$x(n)=y_4(n)+p(n-1) \quad (18)$$

It should be appreciated that equations (17), (16), and (14) are derivable by rearranging equations (2), (4), and (3) above respectively, while equation (18) may be derived from rearranging equations (6) and (1) together. Equations (15) and (13) are tautologies which result from the fact that the new states $s(n-2)$ and $r(n-2)$ are taken directly from the respective previous states $s(n-1)$ and $r(n-1)$.

As seen in FIG. 4b, the systematic Cole code may also be used as a three-to-four code with outputs $y_3(n)$, $y_2(n)$, $y_1(n)$, and $y_0(n)$. Essentially, the embodiment of FIG. 4b is identical to the embodiment of FIG. 4a (with like parts being numbered identically except for the identifiers "a" and "b"), except that at all times t, zero is substituted for $y_4(n)$. As a result, one adder (236a) is not required, and in the state update, one equation (equation (12)) is modified so that new $w_1=w_2$. Thus, it is seen that the Cole code supports a three-to-four systematic convolutional encoder as well as a four-to-five systematic convolutional encoder.

There have been described herein systematic and non-systematic convolutional encoders which implement the Cole code. While particular embodiments have been described, it is not intended that the invention be limited thereto, as it is intended that the invention be as broad in scope as the art will allow and that the specification be read likewise. Thus, while particular systematic and non-systematic encoders have been shown, it will be appreciated that the convolutional encoders of the invention which implement the Cole code can be used effectively with different systematic and non-systematic encoders. Likewise, while particular circuitry has been shown for implementing the systematic and non-systematic embodiments of the Cole code, it will be appreciated that other circuitry can be utilized to implement the state updates and output calculations from the inputs and the states of the sixty-four state convolutional encoders. For example, look-up tables can be used either in part (in conjunction with delay lines) or exclusively (without delay lines) for accomplishing state updates and/or for generating outputs. The state update would be accomplished in the look-up table by taking the six current state bits, and the four input bits, and going to a ten bit address in the table which would be programmed to provide the next state. Furthermore, the state storing mechanism, instead of being a shift register or the like, can assume the form of memory means with a pointer pointing to one of sixty-four states, where the pointer is updated at the clock for every 4D symbol. It will therefore be appreciated by those skilled in the art that yet other modifications could be made to the provided invention without deviating from its spirit and scope as so claimed.

I claim:

1. A sixty-four state convolutional encoder for a non-systematic encoder of a modem, said sixty-four state convolutional encoder receiving at least three inputs $p(n)$, $r(n)$ and $s(n)$, and having a current state, comprising:

a) state means for storing the current state of the convolutional encoder, the current state being defined by six state variables, said six state variables being $r(n-1)$, $r(n-2)$, $s(n-1)$, $s(n-2)$, $p(n-1)$, and $x(n-1)$, where $x(n-1)$ is equal to the sum of $p(n-2)$ plus a first variable, where the first variable is zero when said at least three inputs constitutes exactly three inputs;

b) means for updating the current state of the convolutional encoder to a new state by updating said six state variables from old values to new values, where the new value for state variable $r(n-1)$ is the old value of input $r(n)$, the new value for state variable $r(n-2)$ is the old value of state variable $r(n-1)$, the new value for state variable $s(n-1)$ is the old value of input $s(n)$, the new value for state variable $s(n-2)$ is the old value of state variable $s(n-1)$, the new value for state variable $p(n-1)$ is the old value for input $p(n)$, and the new value for state variable $x(n-1)$ is equal to the sum of the old value for state variable $p(n-1)$ plus a second variable, where the second variable is zero when said at least three inputs constitute exactly three inputs; and c) means for generating at least four outputs $y_3(n)$, $y_2(n)$, $y_1(n)$, and $y_0(n)$ from said six state variables of said current state and from said at least three inputs according to at least four output equations $$y_3(n)=p(n)+r(n)r(n-1)+r(n-2)+r(n-1)s(n)+r(n-1)s(n-2)$$

$$y_2(n)=r(n-1)+s(n)+s(n-2)$$

$$y_1(n)=r(n)+r(n-1)r(n-2)+p(n-1)+p(n-2)+q(n-1)$$

$$y_0(n)=s(n-1).$$

2. A sixty-four state convolutional encoder according to claim 1, wherein:

said means for updating includes first delay means for delaying $s(n)$ to obtain $s(n-1)$, a second delay means for delaying $s(n-1)$ to obtain $s(n-2)$, a third delay means for delaying $r(n)$ to obtain $r(n-1)$, a fourth delay means for delaying $r(n-1)$ to obtain $r(n-2)$, a fifth delay means for delaying $p(n)$ to obtain $p(n-1)$, and a sixth delay means for delaying $p(n-1)$ to obtain $p(n-2)$.

3. A sixty-four state convolutional encoder according to claim 2, wherein:

said first delay means, second delay means, third delay means, fourth delay means, fifth delay means and sixth delay means comprise a plurality of register means.

4. A sixty-four state convolutional encoder according to claim 1, wherein:

said means for generating comprises logic circuitry including means for binary addition and means for binary multiplication.

5. A sixty-four state convolutional encoder according to claim 2, wherein:

said means for generating comprises logic circuitry including means for binary addition coupled to said second delay means, to said third delay means, to said fourth delay means, and to said fifth delay means, and means for binary multiplication coupled to said third delay means.

6. A sixty-four state convolutional encoder according to claim 1, wherein:

said means for binary multiplication is further coupled to said fourth delay means.

7. A sixty-four state convolutional encoder according to claim 1, wherein:

said means for updating comprises a look-up table, with said six state variables and said at least three inputs constituting addressing means for said look-up table, and said look-up table storing said new state variables as a function of address.

8. A sixty-four state convolutional encoder according to claim 1, wherein:

said at least three inputs includes a fourth input q(n), said first variable is q(n−1), said second variable is the old value of the fourth input q(n), said at least four outputs includes a fifth output $y_4(n)$, and said output equations include $y_4(n)=q(n)$.

9. A sixty-four state convolutional encoder according to claim 8, wherein:

said means for updating includes a first delay means for delaying s(n) to obtain s(n−1), a second delay means for delaying s(n−1) to obtain s(n−2), a third delay means for delaying r(n) to obtain r(n−1), a fourth delay means for delaying r(n−1) to obtain r(n−2), a fifth delay means for delaying p(n) to obtain p(n−1), a sixth delay means for delaying p(n−1) to obtain p(n−2), and a seventh delay means for delaying q(n) to obtain q(n−1).

10. A sixty-four state convolutional encoder for a systematic encoder of a modem, said sixty-four state convolutional encoder receiving at least three inputs $y_1$, $y_2$, and $y_3$, and having a current state, comprising:

a) state means for storing the current state of the convolutional encoder, the current state being defined by six state variables, said six state variables being $w_1$, $w_2$, $w_3$, $w_4$, $w_5$, and $w_6$; and b) means for updating the current state of the convolutional encoder to a new state by updating said six state variables respectively to new state variables according to the state equations new $w_6 = w_5$ new $w_5 = y_2 + w_3 + w_6$ new $w_4 = w_3$ new $w_3 = y_1 + w_3 w_4 + w_2 + w_1$ new $w_2 = y_3 + (\text{new } w_3) w_3 + w_4 + w_3 (\text{new } w_5) + w_3 w_6$ new $w_1 = y_4 + w_2$ where $y_4$ is a variable equal to zero when said at least three inputs comprises exactly three inputs, wherein an output $y_0$ of said sixty-four state convolutional encoder is taken as equal to state variable $w_5$ of said current state.

11. A sixty-four state convolutional encoder according to claim 10, wherein:

said means for updating includes a first delay means for delaying $w_1$, a second delay means for delaying $w_2$, a third delay means for delaying $w_3$, a fourth delay means for delaying $w_4$, a fifth delay means for delaying $w_5$, and a sixth delay means for delaying $w_6$.

12. A sixty-four state convolutional encoder according to claim 11, wherein:

said means for updating further comprises logic circuitry including means for binary addition and means for binary multiplication.

13. A sixty-four state convolutional encoder according to claim 12, wherein:

said means for binary addition are coupled to said first delay means, to said second delay means, to said third delay means, to said fourth delay means, to said fifth delay means, and to said sixth delay means, and said means for binary multiplication are coupled to said third delay means.

14. A sixty-four state convolutional encoder according to claim 13, wherein:

said means for binary multiplication are further coupled to an input to said fifth delay means.

15. A sixty-four state convolutional encoder according to claim 10, wherein:

said at least three inputs includes a fourth input, said fourth input being said variable $y_4$.

16. A sixty-four state convolutional encoder according to claim 10, wherein:

said means for updating comprises a look-up table, with said six state variables and said at least three inputs constituting addressing means for said look-up table, and said look-up table storing said new state variables as a function of address.

* * * * *